(12) United States Patent
Kobinata

(10) Patent No.: US 6,462,346 B1
(45) Date of Patent: Oct. 8, 2002

(54) MASK INSPECTING APPARATUS AND MASK INSPECTING METHOD WHICH CAN INSPECT MASK BY USING ELECTRON BEAM EXPOSURE SYSTEM WITHOUT INDEPENDENTLY MOUNTING ANOTHER MASK INSPECTING APPARATUS

(75) Inventor: Hideo Kobinata, Tokyo (JP)

(73) Assignee: NEC Corporation, Tokyo (JP)

( * ) Notice: Subject to any disclaimer, the term of this patent is extended or adjusted under 35 U.S.C. 154(b) by 31 days.

(21) Appl. No.: 09/721,945

(22) Filed: Nov. 27, 2000

(30) Foreign Application Priority Data

Nov. 29, 1999 (JP) .............................. 11-337341

(51) Int. Cl.[7] ................................. H01J 37/00
(52) U.S. Cl. ................. 250/492.2; 250/692.3; 250/310
(58) Field of Search .................... 250/492.3, 492.2, 250/310, 311, 306, 307, 692.3

(56) References Cited

U.S. PATENT DOCUMENTS 5,051,585 A * 9/1991 Koshishiba et al. ........ 250/306
5,892,224 A * 4/1999 Nagasuji et al. ............ 250/310

FOREIGN PATENT DOCUMENTS

JP 63-38149 2/1988
JP 4-361544 12/1992

* cited by examiner

Primary Examiner—Bruce Anderson
Assistant Examiner—Zia R. Hashmi
(74) Attorney, Agent, or Firm—McGinn & Gibb, PLLC

(57) ABSTRACT

A mask inspecting method includes (a), (b), (c), and (d). The (a) includes providing an electron beam exposure system used for patterning a wafer with a mask. The (b) includes emitting electrons to the mask from the electron beam exposure system. The (c) includes detecting an electron passing through the mask of the emitted electrons. The (d) includes inspecting the mask for a defect based on a detected result of the (c).

24 Claims, 7 Drawing Sheets

MASK INSPECTING APPARATUS AND MASK INSPECTING METHOD WHICH CAN INSPECT MASK BY USING ELECTRON BEAM EXPOSURE SYSTEM WITHOUT INDEPENDENTLY MOUNTING ANOTHER MASK INSPECTING APPARATUS

BACKGROUND OF THE INVENTION

1. Field of the Invention

The present invention relates to an inspecting apparatus and an inspecting method of inspecting a defect of a mask used in an electron beam exposure system which carries out a pattern transcription by using an electron beam.

2. Description of the Related Art

Conventionally, a method of emitting a laser light to a mask, and comparing a pattern generated through its transmission light or its reflection light with a reference pattern to detect a defect of the mask has been well known as a method of inspecting a pattern of a mask used in an electron beam exposure system.

However, when a defect of a stencil mask or a membrane mask used in a recent electron beam exposure system is inspected, a laser light is not transmitted through the membrane. Thus, there is no method but the usage of the reflection light. It is easy to use the reflection light of the laser light to then inspect the defect. However, a film thickness of a scattering heavy metal of the membrane mask is typically thin. Hence, it is below a wave length of the laser light. This may result in a fear that the detection is impossible.

Figure 1:
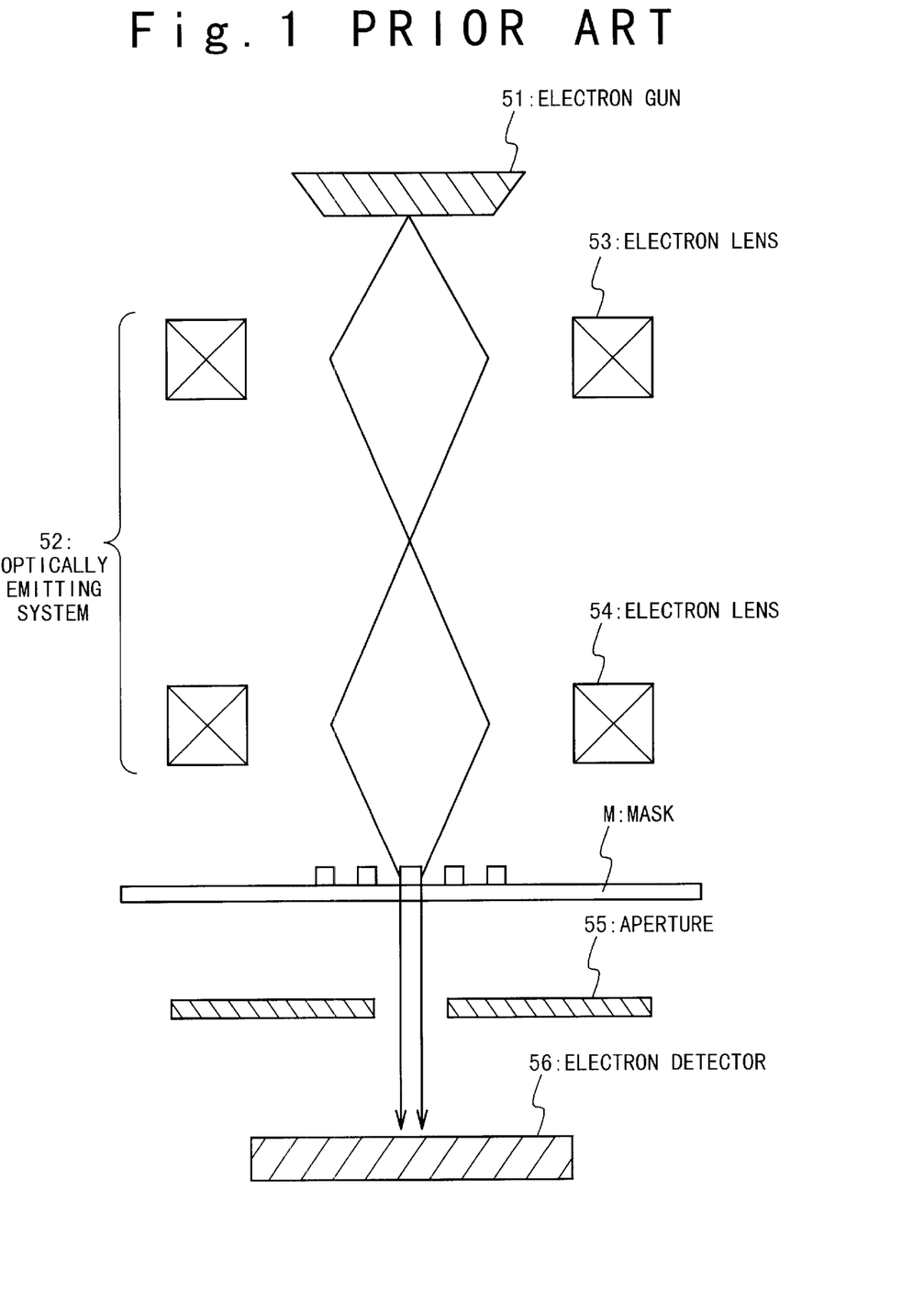
FIG. 1 is a front view showing a diagrammatic configuration of a conventional mask inspecting apparatus.

For this reason, the method of inspecting the defect of the membrane mask uses a transmission electron microscope (TEM) which uses an electron beam to thereby inspect the defect of the membrane mask. In this TEM, as shown in a schematic configuration of FIG. 1, an electron beam EB emitted by an electron gun 51 mounted above a mask M is converged by an optically emitting system 52 containing electron lens 53, 54, to be emitted to the mask M. The electron beam transmitted through the mask M is passed through an aperture 55 made of Cu material to be detected by an electron detector 56. The pattern of the mask M is detected on the basis of a value of a current detected by the electron detector 56. The detected pattern of the mask M is compared with a reference pattern to thereby inspect the defect of the mask M. This usage of the electron beam enables the defect of the stencil mask or the membrane mask to be detected. Such technique is disclosed in, for example, Japanese Laid Open Patent Application (JP-A-Heisei, 4-361544), although it does not describe the membrane mask or the stencil mask in particular.

A conventional apparatus for inspecting a defect of a mask is constituted as an apparatus dedicated to a mask inspection. For this reason, a factory for manufacturing a semiconductor apparatus requires an equipment of a mask inspecting apparatus, apart from an apparatus for manufacturing a semiconductor apparatus. It requires a reservation of space to install the mask inspecting apparatuses in addition to a space to install the apparatus for manufacturing the semiconductor apparatus in the manufacturing factory. Also, this type mask inspecting apparatus requires the configuration similar to that of the electron beam exposure system, as an electron gun or an optically emitting system for emitting an electron beam to a mask. This results in a problem that the mask inspecting apparatus becomes larger and more expensive.

Also, in the conventional inspection of the mask defect, the electron detector detects the electron beam transmitted through the mask to thereby detect the pattern of the mask. Then, the detected pattern is compared with the reference pattern. Thus, there may be a fear that a trouble is induced in a reliability of the mask defect inspection. That is, the detected pattern is made into signals in which the detected pattern is converted into binary values at a fine region unit. A binary signal of a fine detecting region of the detected pattern is compared with a binary signal of a region corresponding to the fine detecting region of the reference pattern. Accordingly, a portion where both the signals are not in coincidence with each other is judged as the defect of the mask. However, in this case, if an error is induced in a reference level when each of the fine regions of the detected pattern is converted into the binary value, the reliability of the binary value itself in which each of the fine regions of the detected pattern is converted into the binary value is dropped, which results in a drop of a reliability of the defect inspection.

Japanese Laid Open Patent Application (JP-A-Showa, 63-38149) discloses a pattern defect inspector as described below. The pattern defect inspector is provided with a device for scanning on a substrate in which one or more rectangular patterns are formed, a device for detecting a signal occurring from the substrate through the scanning operation, a device for treating the detected signal and thereby obtaining a binary information, a device for converting the binary information into a plurality of rectangular pattern information, a device for accumulating therein the rectangular pattern information, and a device for comparing the rectangular pattern information with a standard data corresponding to the rectangular pattern information.

SUMMARY OF THE INVENTION

The present invention is accomplished in view of the above mentioned problems. Therefore, an object of the present invention is to provide a mask inspecting apparatus which can inspect a mask by using an electron beam exposure system and accordingly cancel out a need for an independent installation of another mask inspecting apparatus. Another object of the present invention is to provide a mask inspecting method which can improve a reliability in an inspection of a defect of a mask.

In order to achieve an aspect of the present invention, a mask inspecting method, includes: (a) providing an electron beam exposure system used for patterning a wafer with a mask; (b) emitting electrons to the mask from the electron beam exposure system; (c) detecting an electron passing through the mask of the emitted electrons; and (d) inspecting the mask for a defect based on a detected result of the (c).

In this case, the (b) is performed such that the electrons emitted from the electron beam exposure system are not emitted to the wafer.

Also in this case, the mask inspecting method, further includes: (e) performing an exposure to the wafer through the mask for patterning by using the electron beam exposure system when the mask has no defect as a result of the (d).

Further in this case, in the (b) the electrons are emitted from the electron beam exposure system in such a manner that the (e) is performed.

In this case, the mask inspecting method, further includes: (f) providing a reference pattern data indicating a reference pattern of the mask; and (g) calculating an area rate implying a ratio of a black pattern to a white pattern included in a portion data corresponding to a inspecting region of the mask of the reference pattern data, and wherein the (d) includes inspecting the mask for the defect based on the detected result of the (c) and the area rate.

Also in this case, the (c) includes detecting a strength of the electron passing through the mask, and the mask inspecting method, further includes: (h) providing a reference pattern data indicating a reference pattern of the mask; and (i) calculating an area rate implying a ratio of a black pattern to a white pattern included in a portion data corresponding to a inspecting region of the mask of the reference pattern data, and wherein the (d) includes inspecting the mask for the defect based on the strength of the electron and the area rate.

Further in this case, the mask inspecting method, further includes: (j) calculating a correction value indicating a relation between the strength of the electron and the reference pattern, and wherein the (d) includes inspecting the mask for the defect based on the strength of the electron and the correction value, and the area rate.

In this case, the (c) is performed by an electron detector, and wherein the electron detector is automatically movable from a position where the electron detector covers a position of the wafer such that the electron passing through the mask is not emitted to the position of the wafer to another position where the electron detector does not cover the position of the wafer such that the electron passing through the mask is emitted to the position of the wafer.

Also in this case, the (c) includes detecting the electron passing through the mask to detect a position in the electron detector when the electron is inputted to the electron detector and a strength of the inputted electron.

Further in this case, the electron detector includes a plurality of diodes arranged in a form of array.

In this case, the electron detector includes a plurality of diodes arranged in a grid form.

Also in this case, the mask inspecting method, further includes: (k) providing an MCP (Micro Channel Plate) having a plurality of holes in a position between the electron detector and the mask; and (l) applying a voltage to the MCP, and wherein the (c) includes detecting a position in the MCP when the electron is inputted to the MCP and a strength of the inputted electron.

In order to achieve another aspect of the present invention, a mask inspecting apparatus, includes: an electron beam exposure system used for patterning a wafer with a mask, the electron beam exposure system emitting electrons to the mask; an electron detector detecting an electron passing through the mask of the emitted electrons; and an inspecting unit inspecting the mask for a defect based on a detected result by the electron detector.

In this case, when the electron detector detects the electron passing through the mask, the electrons emitted from the electron beam exposure system are not emitted to the wafer.

Also in this case, the electron beam exposure system performs an exposure to the wafer through the mask for patterning when the mask has no defect as an inspection result by the inspecting unit.

Further in this case, when the electron detector detects the electron passing through the mask, the electron beam exposure system emits the electrons in such a manner that the electron beam exposure system performs the exposure to the wafer through the mask for patterning.

In this case, the inspecting unit stores a reference pattern data indicating a reference pattern of the mask and calculates an area rate implying a ratio of a black pattern to a white pattern included in a portion data corresponding to a inspecting region of the mask of the reference pattern data, and wherein the inspecting unit inspects the mask for the defect based on the detected result by the electron detector and the area rate.

Also in this case, the electron detector detects a strength of the electron passing through the mask, and wherein the inspecting unit stores a reference pattern data indicating a reference pattern of the mask and calculates an area rate implying a ratio of a black pattern to a white pattern included in a portion data corresponding to a inspecting region of the mask of the reference pattern data, and wherein the inspecting unit inspects the mask for the defect based on the strength of the electron and the area rate.

Further in this case, the inspecting unit calculates a correction value indicating a relation between the strength of the electron and the reference pattern, and wherein the inspecting unit inspects the mask for the defect based on the strength of the electron and the correction value, and the area rate.

In this case, the electron detector is automatically movable from a position where the electron detector covers a position of the wafer such that the electron passing through the mask is not emitted to the position of the wafer to another position where the electron detector does not cover the position of the wafer such that the electron passing through the mask is emitted to the position of the wafer.

Also in this case, the electron detector detects the electron passing through the mask to detect a position in the electron detector when the electron is inputted to the electron detector and a strength of the inputted electron.

Further in this case, the electron detector includes a plurality of diodes arranged in a form of array.

In this case, the electron detector includes a plurality of diodes arranged in a grid form.

Also in this case, the mask inspecting apparatus, further includes:
an MCP (Micro Channel Plate) having a plurality of holes in a position between the electron detector and the mask, a voltage being applied to the MCP, and wherein the MCP detects a position in the MCP when the electron is inputted to the MCP and a strength of the inputted electron.

DESCRIPTION OF THE PREFERRED EMBODIMENTS

Embodiments of the present invention will be described below with reference to the drawings.

Figure 2:
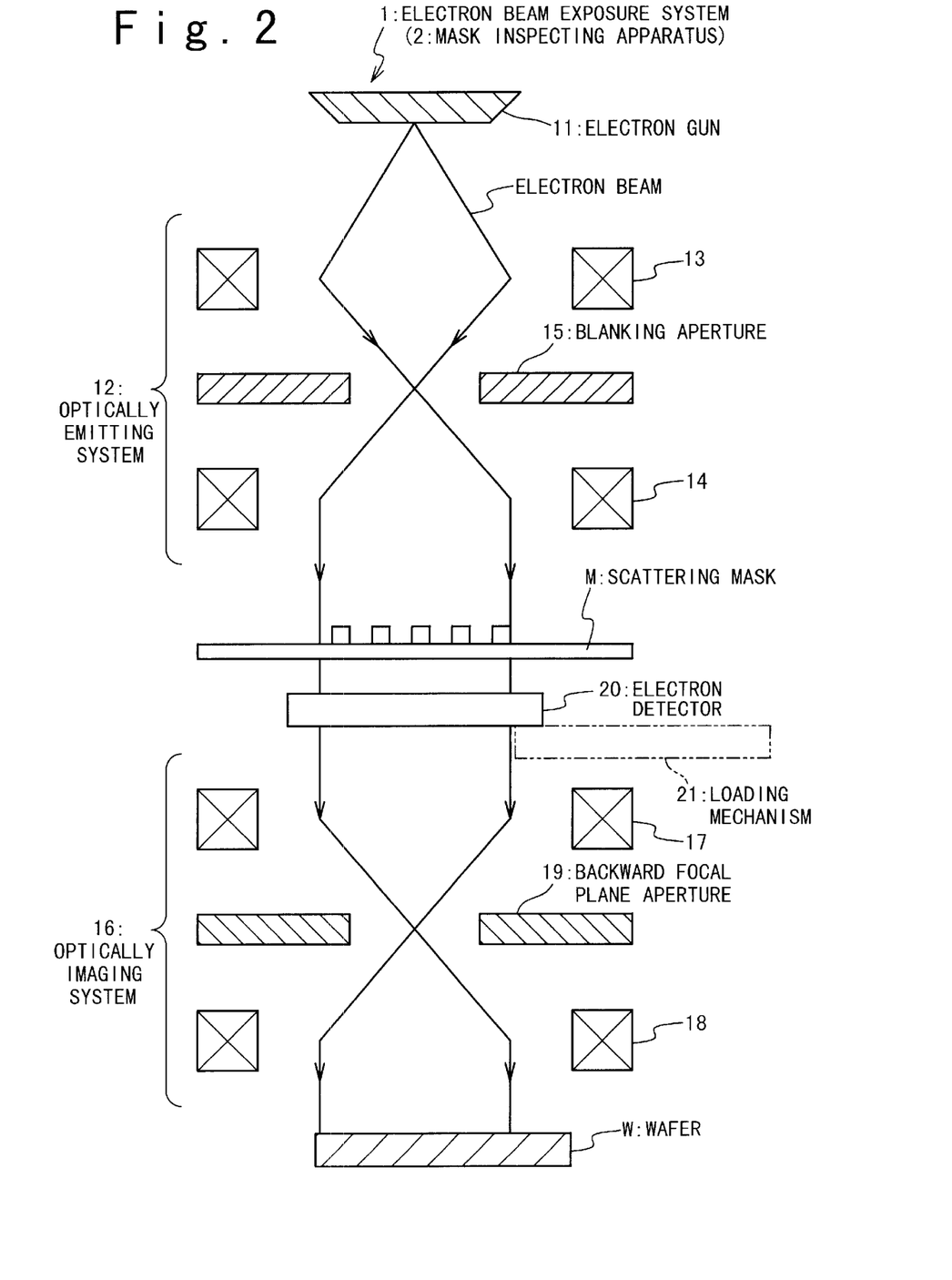
FIG. 2 is a front view showing a diagrammatic configuration of a mask inspecting apparatus of an embodiment of the present invention.
Figure 3:
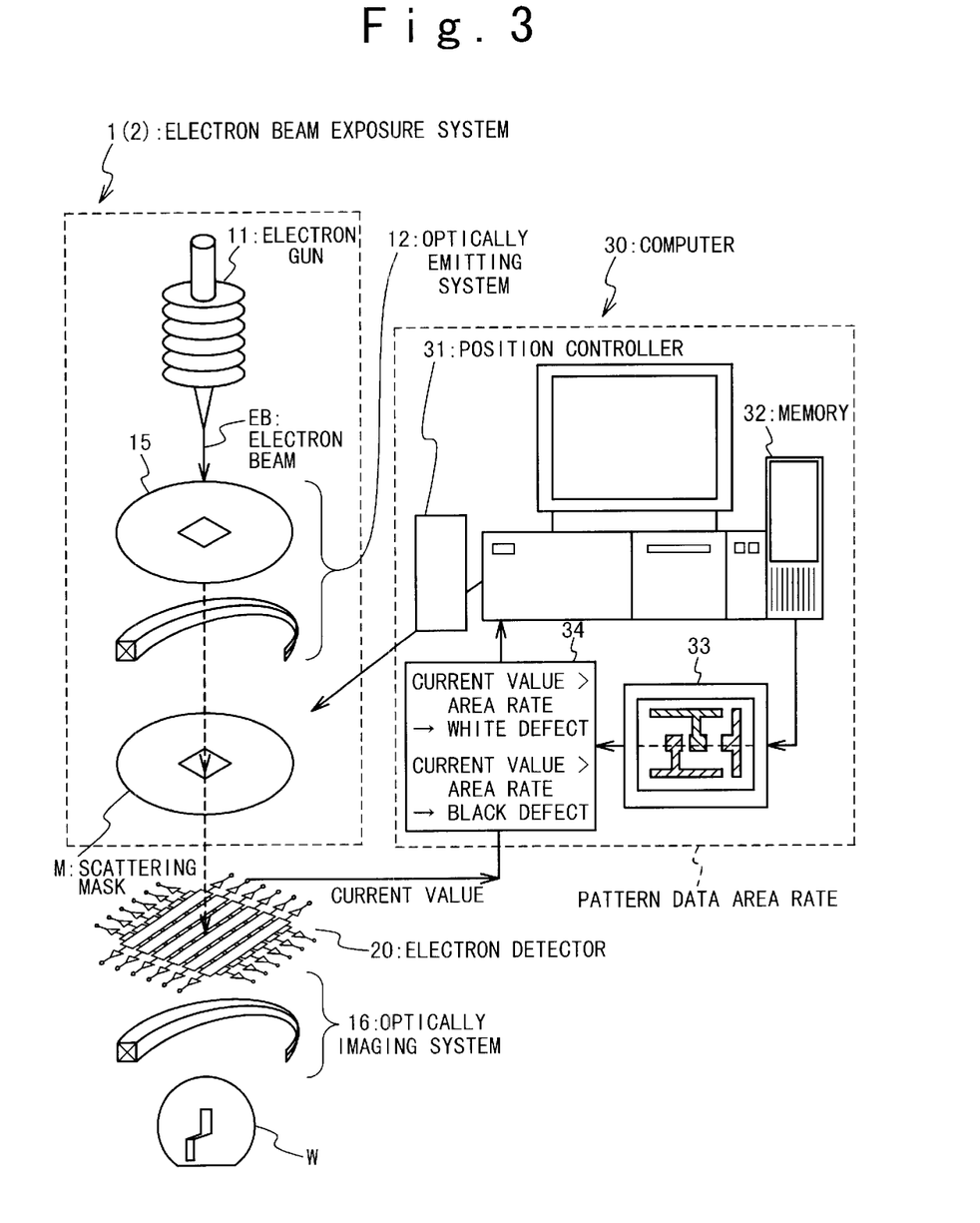
FIG. 3 is a diagrammatically perspective configuration view of the mask inspecting apparatus of FIG. 2.

FIG. 2 is a side view showing a mask inspecting apparatus in this embodiment. FIG. 3 is a perspective view showing the mask inspecting apparatus in this embodiment. A mask inspecting apparatus 2 in this embodiment is constituted by an electron beam exposure system 1 for drawing a picture through scattering electrons.

The mask inspecting apparatus 2 inspects a defect of a scattering mask M. The scattering mask M has a pattern needed for a transcription to a wafer W.

The mask inspecting apparatus 2 is provided with an electron gun 11 for emitting an electron beam, electron lens 13, 14, a blanking aperture 15, electron lens 17, 18 and a backward focal plane aperture 19.

The electron lens 13, 14 and the blanking aperture 15 are contained in an optically emitting system 12. The electron lens 17, 18 and the backward focal plane aperture 19 are contained in an optically imaging system 16.

The electron lens 13, 14 converge electron beams EB emitted by the electron gun 11. The blanking aperture 15 converts a flux of electron beams into a necessary shape. The electron lens 17, 18 are used to project and transcript the electron beams EB scattering by the scattering mask M to the wafer W.

An electron detector 20 for inspecting the mask defect is mounted immediately beneath the scattering mask M. When the pattern is transcribed to the wafer W, the electron detector 20 is detached from the electron beam exposure system 1 such that a usual operation for exposing an electron beam EB can be performed. On the other hand, the electron detector 20 is mounted within the electron beam exposure system 1 at a time of the inspection of the defect of the mask M.

By the way, a loading mechanism 21 is mounted such that the electron detector 20 can be mounted in and detached from the electron beam exposure system 1. However, the detailed explanation thereof is omitted here. Moreover, a computer 30 is connected to the electron beam exposure system 1 (mask inspecting apparatus 2) so that the defect of the mask M is inspected.

Here, the already-known membrane mask or stencil mask is used as the scattering mask M. In the membrane mask, a pattern, which services as a scatterer and has a high atomic number and a high density, is formed on a membrane film made of a material having a low atomic number and a low density. A difference between scattering degrees of electrons is used to reserve a beam contrast. The stencil mask slightly differs from the membrane mask in that a pattern portion of the stencil mask is made of a material having a thick film, such as silicon or the like. However, the stencil mask basically has the configuration similar to that of the membrane mask.

The mask M can be moved in a direction of a flat surface XY through a mask stage (not shown). So, the entire pattern of the mask M is transcribed to the wafer W while moved in the direction of the flat surface XY. The wafer W is similarly placed on a wafer stage (not shown), and can be moved in the direction of the flat surface XY, synchronously with the mask stage.

Figure 4A:
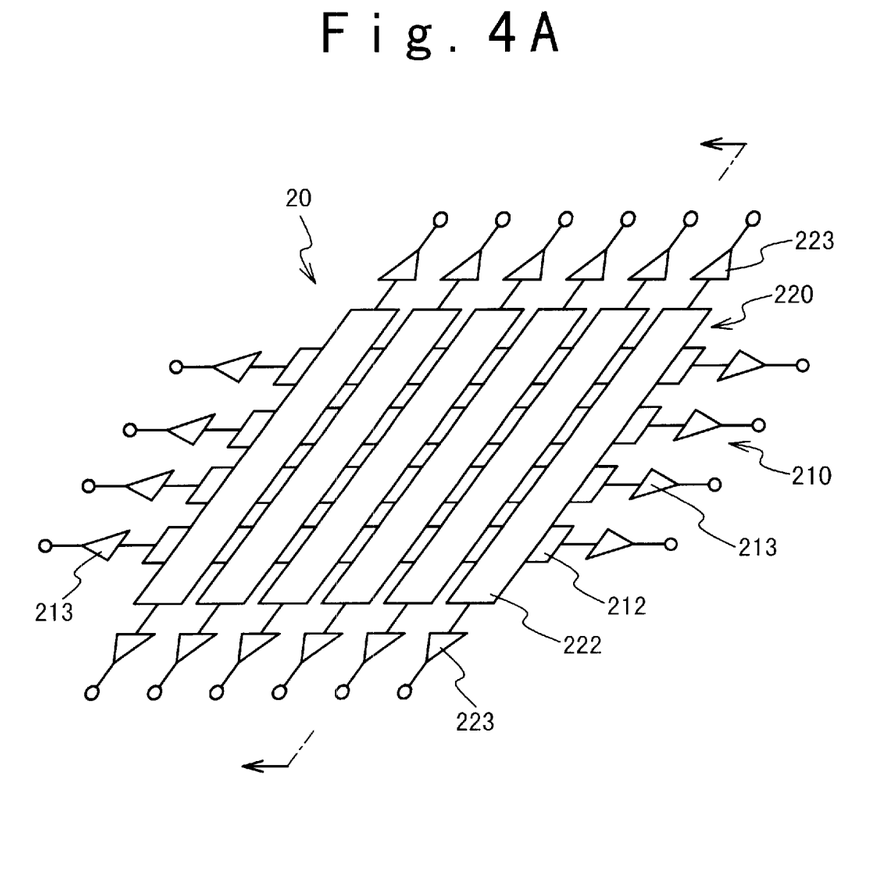
FIG. 4A is a perspective view showing a configuration of an electron detector contained in the mask inspecting apparatus of FIG. 2.
Figure 4B:
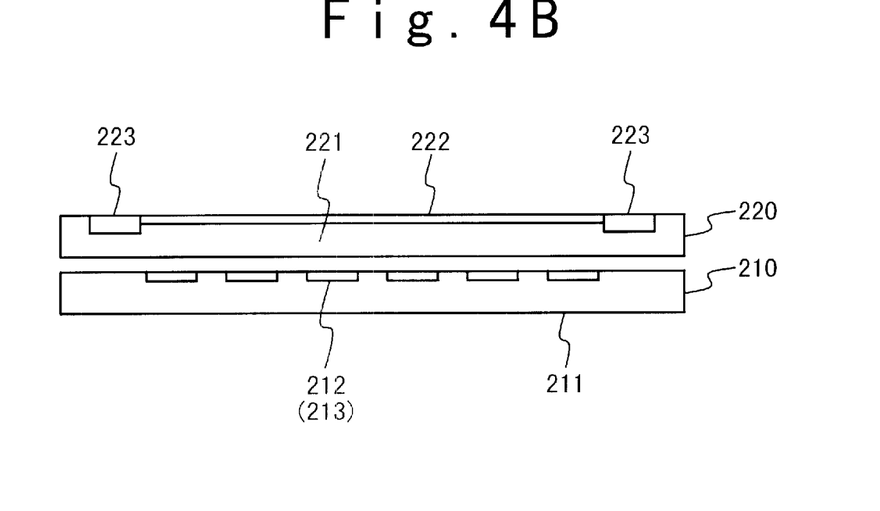
FIG. 4B is a section view showing a configuration of the electron detector contained in the mask inspecting apparatus of FIG. 2.

As shown in FIG. 4A, the electron detector is configured such that diodes 210, 220 arranged in upper and lower two layers, respectively, and made of thin film silicon are arranged in a form of array. As shown in FIG. 4B, in the diodes 210 of the lower layer and the diodes 220 of the upper layer, a plurality of N-type impurity layers 212, 222 which are rectangular-shaped and extending in an X-direction and a Y-direction, respectively, are arranged parallel to each other on surface portions of P-type thin film silicon 211, 221, respectively. Also, in the diodes 210 of the lower layer and the diodes 220 of the upper layer, amplifiers 213, 223 respectively composed of transistors and the like are formed at both ends in longitudinal directions of the respective N-type impurity layers 212, 222, respectively.

A reverse bias is applied between the P-type thin film silicon 211, 221 and the N-type impurity layers 212, 222 so that a steady state is kept in which currents do not flow. Then, currents caused by holes and second electrons generated by electrons inputted to the N-type impurity layers 212, 222 of the respective diodes 221, 220 are amplified by the respective amplifiers 213, 223 to thereby detect the values of the currents. Also, the computer 30 uses those current values to detect the positions of the input electrons, and thereby inspect the mask defect.

That is, in FIG. 3, the computer 30 is provided with a memory 32, such as a record disc or the like, a position controller 31, an area rate calculator 33 and a defect judge section 34.

The position controller 31 controls a movement position in the XY directions on the flat surface of the mask stage (not shown) in which the mask M is at least placed.

The area rate calculator 33 reads out a pattern data corresponding to a pattern of an open region of the mask M limited by the blanking aperture 15, namely, an inspection region, from the memory 32, in accordance with an information of an XY position controlled by the position controller 31. Then, it calculates an area rate of the pattern data, namely, "area rate" implying a ratio of a black pattern to a white pattern in the mask. The calculated area rate is reference data when the defect judge section 34 performs a defect judgement.

The defect judge section 34 compares the calculated area rate with a current value which is a measured result of a current amplified by each of the amplifiers 213, 223 of the electron detector 20. Accordingly, it judges a white defect (an omission of a pattern region) and a black defect (an excessive pattern) in the mask, in accordance with the compared result.

The mask inspecting apparatus 2 using the electron beam exposure system 1 having the above-mentioned configuration will be described below.

At first, before the mask is usually transcribed, the electron detector 20 is mounted in a portion immediately beneath the mask M within the electron beam exposure system 1, as shown in FIGS. 2 and 3.

Next, similarly to the case of the pattern transcription, the optically emitting system 12 emits the electron beam emitted by the electron gun 11 to the mask M set in the electron beam exposure system 1. Here, as mentioned above, the pattern portion on the membrane mask is made of the heavy metal, and the pattern portion of the stencil mask is made of the material having the thick film such as silicon and the like. So, the electrons emitted to the pattern portion of the membrane mask or the stencil mask are scattering at a large angle a plurality of times. Thus, there is a high possibility that the electrons emitted to the pattern portion are scattering outside the electron detector 20. Or, even if electrons emitted to the pattern portion are tentatively inputted to the electron detector 20, the number of electrons scattering at the same angle as the inputted electrons is relatively small. Hence, the signal becomes very weal so that it can not be detected. Electrons emitted to a portion having no pattern, namely a portion other than the pattern portion are transmitted through the mask M to be inputted to the respective diodes 210, 220 of the electron detector 20. The electron beams inputted to the respective diodes 210, 220 excite silicon atoms in the material the respective diodes 210, 220 of at a certain probability to generate the second electrons and the holes.

Figure 5:
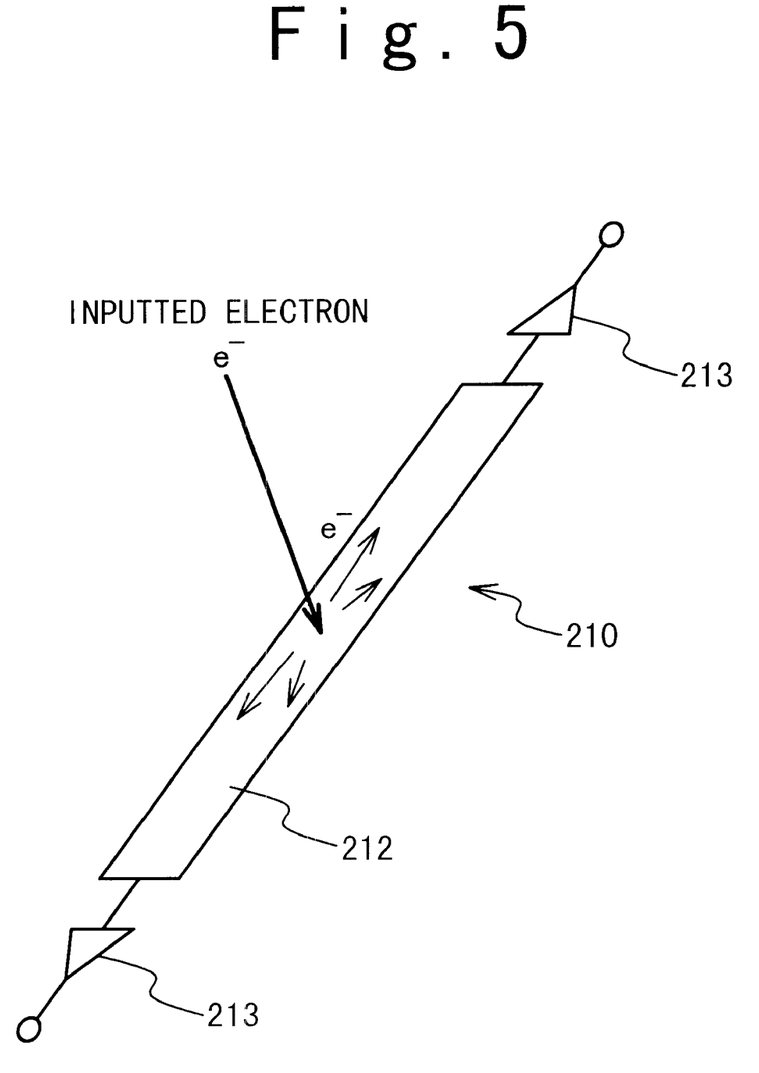
FIG. 5 is a concept view describing a current detection operation at each diode of the electron detector contained in the mask inspecting apparatus of FIG. 2.

Those second electrons and those holes are moved to the amplifiers 213 by an electric field applied to the diode 210 (the P-type silicon 211 and the N-type impurity layers 212), as shown in the concept view of the diode 210 of FIG. 5. At this time, since the silicon diode 210 has a certain resistance, the resistance causes the current to be attenuated at a certain rate. The inputted position of the electron can be specified by measuring the rate of the attenuation based on the current read out from the amplifiers 213 on both the sides of the diodes 210. Moreover, a strength of the electron can be specified based on the current value. By the way, the specified inputted position is a position in the X-direction in the case of the lower layer diodes 210, and a position in the Y-direction in the case of the upper layer diodes 220. Thus, the total consideration with regard to such positions enables the position on the flat surface XY of the electron detector 20 to be specified.

The position and the strength of the electron specified as mentioned above are inputted to the computer 30, which judges the defect of the mask.

Figure 6:
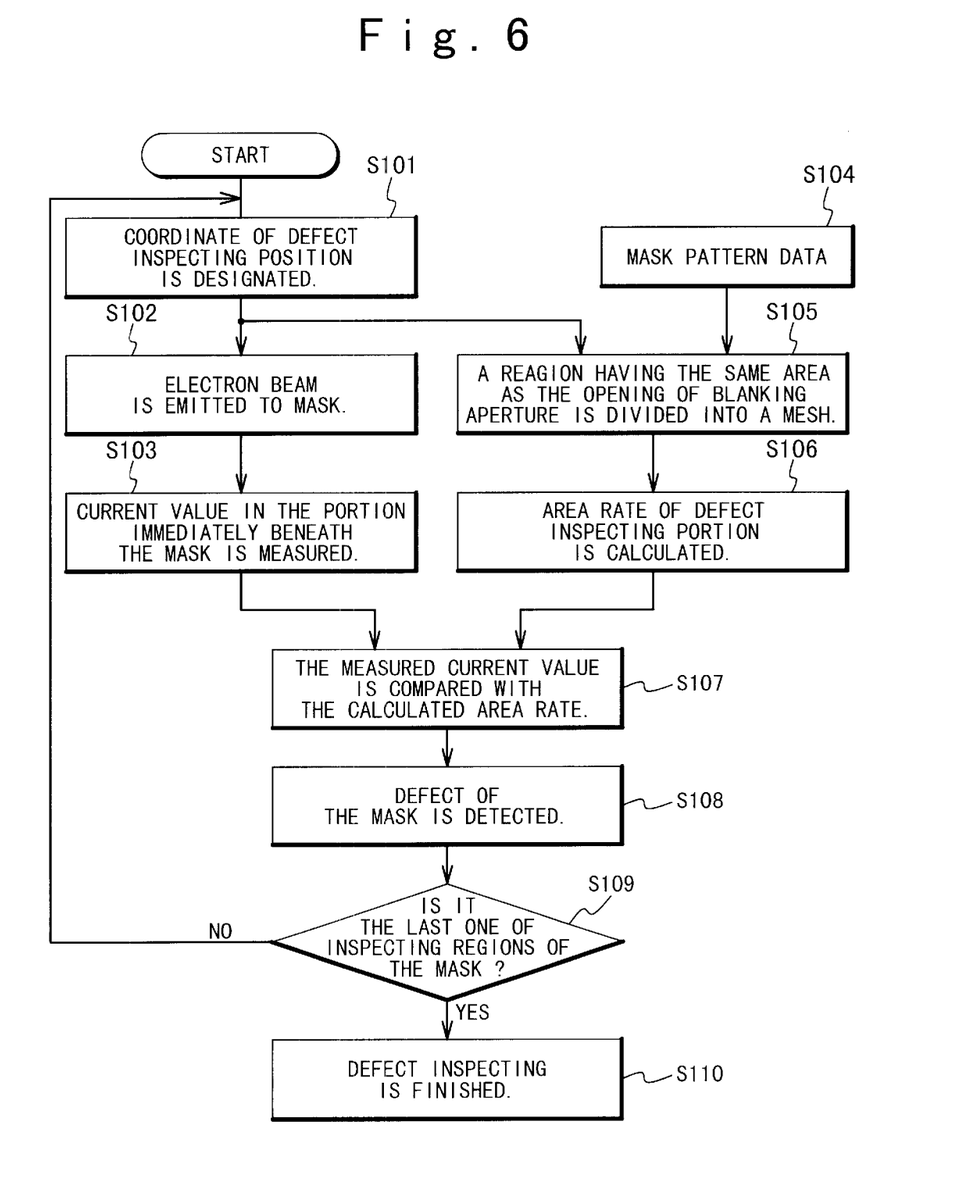
FIG. 6 is a flowchart showing an algorithm in a mask inspecting method of an embodiment of the present invention.

FIG. 6 is a flowchart showing an algorithm to judge the mask defect. At first, the computer 30 controls the mask stage so that an inspection region targeted for the inspection of the mask M is positioned correspondingly to the aperture 15 of the optically emitting system 12 (S101). Accordingly, an electron beam, which is emitted by the electron gun 11 and then transmitted through an opening of the blanking aperture 15 is emitted to the inspection region of the pattern of the mask M (S102). Thus, the electron beam transmitted through the mask M is inputted to the electron detector 20. As mentioned above, the inputted position of the electron beam is specified in accordance with the current outputted by the amplifiers of the electron detector 20. Also the strength of the electron beam is specified based on the measured current value.

On the other hand, the computer 30 reads out a pattern data of the mask M from the memory 32 which stores therein the information of the pattern data of the mask M as the inspection target (S104). Then, a region having the same area as the opening of the blanking aperture 15 is divided into a mesh to be set, based on an XY position of the inspection region of the mask M (S105). After that, the area rate calculator 33 calculates an area rate of the mask based on the pattern data of the set region (S106). This area rate implies a rate of a black pattern to a white pattern in the mask region, as mentioned above.

Next, the defect judge section 34 correlates the inputted position of the electron beam detected at the step S103 with the region of the mask M set at the step S105, and then compares the area rate calculated at the step S106 with the current value measured at the step S103 (S107) to judge the white defect and the black defect in the mask M, in accordance with the compared result (S108).

By the way, in this comparison, only the numerals except the units of the respective values are compared (S107). So, a case of [Area Rate=Current Value] is judged as a no-defect, a case of [Area Rate>Current Value] is judged as the black defect, and a case of [Area Rate<Current Value] is judged as the white defect (S108).

The judgment is repeatedly performed on all regions targeted for the mask inspection, and then the mask inspection is completed (S109, S110).

Here, in the comparison between the area rate and the current value, it is desirable to use the mask, in which a fact that the mask does not have any defect is known in advance and then calculate a correction value indicating a relation between the electron strength and a presence or an absence of the pattern.

This correction value is added to, for example, the current value. Then, the value in which the correction value is added to the current value is compared with the area rate, similarly to the above-mentioned case. Thus, it is possible to cancel out an influence of a detection error in the current value to thereby improve a judgment accuracy of the defect.

The inspection of the defect in the mask can be attained in this way. So, if the electron detector 20 is mounted inside the electron beam exposure system 1, the electron beam exposure system 1 can be configured in its original state as the mask inspecting apparatus 2. Thus, the factory for manufacturing the semiconductor apparatus does not need to configure the mask inspecting apparatus as the independent apparatus. Hence, this is advantageous in reducing a facility space and reducing an entire cost of an equipment for manufacturing the semiconductor apparatus.

The mask M set in the electron beam exposure system 1 can be used in its original state for the exposure to the wafer W after the completion of the mask inspection. Thus, it is also possible to reduce a loss of a processing time caused by the movement between the apparatuses of the mask M.

Moreover, at the time of the inspection of the mask M, the area rate determined based on the pattern data of the mask M is compared with the current value obtained by the electron detector 20. Thus, it is possible to protect the drop of the reliability caused by the error of the reference level when the data is converted into the binary value.

Moreover, instead of the reflection electron or the reflection light in which only the influence on the surface can be considered, the transmission electron is used in which the rate of energy attenuation is different depending on the film thickness. Thus, it is possible to consider the influence of the values (the film thickness of the mask M and the like) contributing to the electron scattering whose appearance can not be inspected.

Figure 7A:
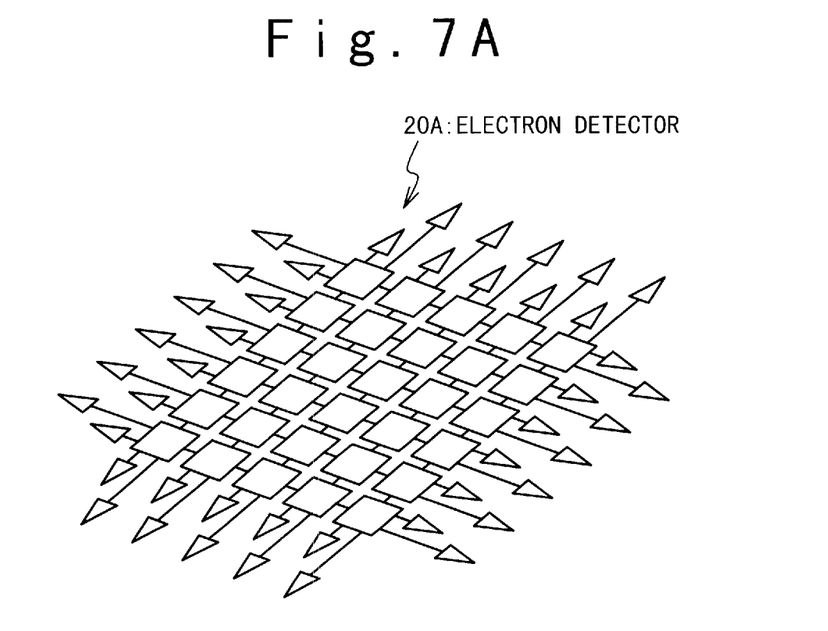
FIG. 7A is a perspective view showing another example of the electron detector contained in the mask inspecting apparatus of FIG. 2.

A grid type of an electron detector 20A in which diodes made of silicon are arranged in XY directions, respectively, as shown in FIG. 7A can be used as a variation of the electron detector 20 used in the embodiment. In this case, an information as to which diode is irradiated with electrons of what strength can be detected based on the current detected in the X-direction and the current detected in the Y-direction. Hence, a two-dimension position and current position can be detected based on the detected information.

Figure 7B:
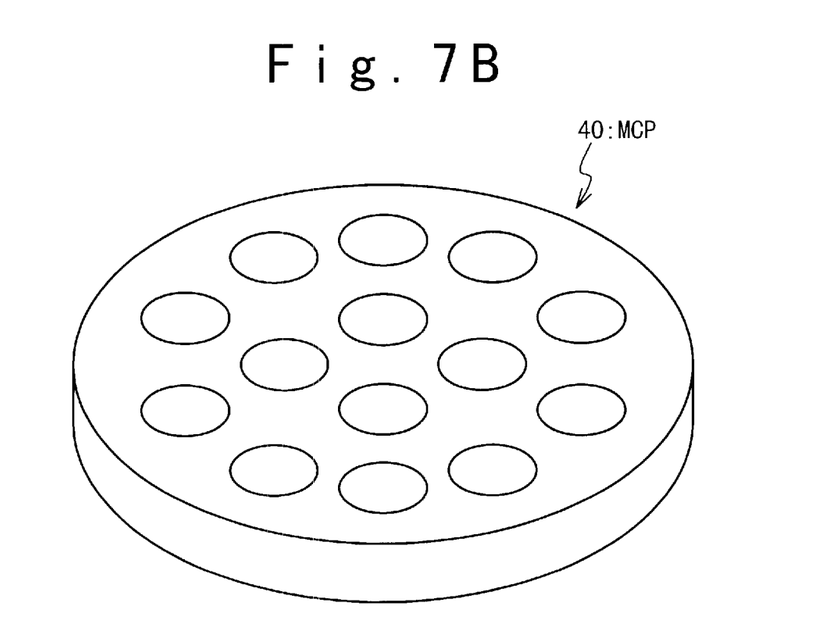
FIG. 7B is a perspective view showing MCP used in the mask inspecting apparatus of FIG. 2.

Also, as shown in FIG. 7B, an MCP (Micro Channel Plate) 40 of a silicon plate having many holes to which a voltage is applied is mounted between a position immediately beneath the mask M and the electron detector 20 or 20A. The MCP 40 is used as a position detector. Also in this case, it is possible to detect an information with regard to the hole to which an electron is inputted and a strength of the inputted electron.

As mentioned above, in the mask inspecting apparatus according to the present invention, the electron detector for detecting the electron beam transmitted through the mask for the mask inspection can be mounted inside and detached from the portion immediately beneath the mask within the electron beam exposure system in which the mask is set. Thus, if the electron detector is mounted within the electron beam exposure system, the electron beam exposure system can be configured in its original state as the mask inspecting apparatus.

Thus, it is not necessary to configure the mask inspecting apparatus independently of the electron beam exposure system. So, this is advantageous in reducing the facility space in the factory for manufacturing the semiconductor apparatus and the like, and reducing the entire cost of the equipment for manufacturing the semiconductor apparatus. Also, the mask set in the electron beam exposure system can be used in its original state for the exposure to the wafer after the completion of the mask inspection. Hence, it is also possible to reduce the loss of the processing time caused by the movement between the apparatuses of the mask.

Moreover, the mask inspecting method in the present invention compares the area rate determined based on the pattern data of the mask targeted for the inspection with the current value obtained by the electron detector for detecting the electron beam transmitted through the mask. Thus, it is possible to protect the drop of the reliability caused by the error of the reference level when the data is converted into the binary value. Furthermore, the defect of the mask can be inspected at the high accuracy and at the high reliability.

What is claimed is:

1. A mask inspecting method, comprising:
   (a) providing an electron beam exposure system used for patterning a wafer with a mask;
   (b) emitting electrons to said mask from said electron beam exposure system;
   (c) detecting an electron passing through said mask of said emitted electrons; and
   (d) inspecting said mask for a defect based on a detected result of said (c).

2. The mask inspecting method according to claim 1, wherein said (b) is performed such that said electrons emitted from said electron beam exposure system are not emitted to said wafer.

3. The mask inspecting method according to claim 1, further comprising:
   (e) performing an exposure to said wafer through said mask for patterning by using said electron beam exposure system when said mask has no defect as a result of said (d).

4. The mask inspecting method according to claim 3, wherein in said (b) said electrons are emitted from said electron beam exposure system in such a manner that said (e) is performed.

5. The mask inspecting method according to claim 1, further comprising:
   (f) providing a reference pattern data indicating a reference pattern of said mask; and
   (g) calculating an area rate implying a ratio of a black pattern to a white pattern included in a portion data corresponding to a inspecting region of said mask of said reference pattern data, and
   wherein said (d) includes inspecting said mask for said defect based on said detected result of said (c) and said area rate.

6. The mask inspecting method according to claim 1, wherein said (c) includes detecting a strength of said electron passing through said mask, and said mask inspecting method, further comprising:
   (h) providing a reference pattern data indicating a reference pattern of said mask; and
   (i) calculating an area rate implying a ratio of a black pattern to a white pattern included in a portion data corresponding to a inspecting region of said mask of said reference pattern data, and
   wherein said (d) includes inspecting said mask for said defect based on said strength of said electron and said area rate.

7. The mask inspecting method according to claim 6, further comprising:
   (j) calculating a correction value indicating a relation between said strength of said electron and said reference pattern, and
   wherein said (d) includes inspecting said mask for said defect based on said strength of said electron and said correction value, and said area rate.

8. The mask inspecting method according to claim 1, wherein said (c) is performed by an electron detector, and
   wherein said electron detector is automatically movable from a position where said electron detector covers a position of said wafer such that said electron passing through said mask is not emitted to said position of said wafer to another position where said electron detector does not cover said position of said wafer such that said electron passing through said mask is emitted to said position of said wafer.

9. The mask inspecting method according to claim 8, wherein said (c) includes detecting said electron passing through said mask to detect a position in said electron detector when said electron is inputted to said electron detector and a strength of said inputted electron.

10. The mask inspecting method according to claim 8, wherein said electron detector includes a plurality of diodes arranged in a form of array.

11. The mask inspecting method according to claim 8, wherein said electron detector includes a plurality of diodes arranged in a grid form.

12. The mask inspecting method according to claim 8, further comprising:
   (k) providing an MCP (Micro Channel Plate) having a plurality of holes in a position between said electron detector and said mask; and
   (l) applying a voltage to said MCP, and
   wherein said (c) includes detecting a position in said MCP when said electron is inputted to said MCP and a strength of said inputted electron.

13. A mask inspecting apparatus, comprising:
   an electron beam exposure system used for patterning a wafer with a mask, said electron beam exposure system emitting electrons to said mask;
   an electron detector detecting an electron passing through said mask of said emitted electrons; and
   an inspecting unit inspecting said mask for a defect based on a detected result by said electron detector.

14. The mask inspecting apparatus according to claim 13, wherein when said electron detector detects said electron passing through said mask, said electrons emitted from said electron beam exposure system are not emitted to said wafer.

15. The mask inspecting apparatus according to claim 13, wherein said electron beam exposure system performs an exposure to said wafer through said mask for patterning when said mask has no defect as an inspection result by said inspecting unit.

16. The mask inspecting apparatus according to claim 15, wherein when said electron detector detects said electron passing through said mask, said electron beam exposure system emits said electrons in such a manner that said electron beam exposure system performs said exposure to said wafer through said mask for patterning.

17. The mask inspecting apparatus according to claim 13, wherein said inspecting unit stores a reference pattern data indicating a reference pattern of said mask and calculates an area rate implying a ratio of a black pattern to a white pattern included in a portion data corresponding to a inspecting region of said mask of said reference pattern data, and wherein said inspecting unit inspects said mask for said defect based on said detected result by said electron detector and said area rate.

18. The mask inspecting apparatus according to claim 13, wherein said electron detector detects a strength of said electron passing through said mask, and wherein said inspecting unit stores a reference pattern data indicating a reference pattern of said mask and calculates an area rate implying a ratio of a black pattern to a white pattern included in a portion data corresponding to a inspecting region of said mask of said reference pattern data, and wherein said inspecting unit inspects said mask for said defect based on said strength of said electron and said area rate.

19. The mask inspecting apparatus according to claim 18, wherein said inspecting unit calculates a correction value indicating a relation between said strength of said electron and said reference pattern, and wherein said inspecting unit inspects said mask for said defect based on said strength of said electron and said correction value, and said area rate.

20. The mask inspecting apparatus according to claim 13, wherein said electron detector is automatically movable from a position where said electron detector covers a position of said wafer such that said electron passing through said mask is not emitted to said position of said wafer to another position where said electron detector does not cover said position of said wafer such that said electron passing through said mask is emitted to said position of said wafer.

21. The mask inspecting apparatus according to claim 13, wherein said electron detector detects said electron passing through said mask to detect a position in said electron detector when said electron is inputted to said electron detector and a strength of said inputted electron.

22. The mask inspecting apparatus according to claim 13, wherein said electron detector includes a plurality of diodes arranged in a form of array.

23. The mask inspecting apparatus according to claim 13, wherein said electron detector includes a plurality of diodes arranged in a grid form.

24. The mask inspecting apparatus according to claim 13, further comprising:

an MCP (Micro Channel Plate) having a plurality of holes in a position between said electron detector and said mask, a voltage being applied to said MCP, and wherein said MCP detects a position in said MCP when said electron is inputted to said MCP and a strength of said inputted electron.

* * * * *